(12) United States Patent
Okushima

(10) Patent No.: US 8,072,032 B2
(45) Date of Patent: Dec. 6, 2011

(54) SEMICONDUCTOR INTEGRATED CIRCUIT DEVICE HAVING LATCHUP PREVENTING FUNCTION

(75) Inventor: Mototsugu Okushima, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 701 days.

(21) Appl. No.: 11/882,802

(22) Filed: Aug. 6, 2007

(65) Prior Publication Data

US 2008/0036011 A1    Feb. 14, 2008

(30) Foreign Application Priority Data

Aug. 8, 2006    (JP) .................................. 2006-215489

(51) Int. Cl.
*H01L 27/085*    (2006.01)
(52) U.S. Cl. ............. 257/372; 257/E21.43; 257/E21.53; 257/E21.55; 257/E21.64; 257/E27.063; 257/E27.067
(58) Field of Classification Search .................. 257/372, 257/E21.43, E21.53, E21.55, E21.64, E27.063, 257/E27.067; 326/121
See application file for complete search history.

(56) References Cited

U.S. PATENT DOCUMENTS

| | | | | |
|---|---|---|---|---|
| 5,347,169 A | * | 9/1994 | Preslar et al. ................. | 327/110 |
| 5,406,523 A | * | 4/1995 | Foss et al. ..................... | 365/226 |
| 5,757,714 A | * | 5/1998 | Choi et al. .................... | 365/226 |
| 5,805,508 A | * | 9/1998 | Tobita ..................... | 365/189.09 |
| 5,889,315 A | * | 3/1999 | Farrenkopf et al. ........... | 257/552 |
| 5,903,420 A | | 5/1999 | Ham | |
| 6,084,255 A | * | 7/2000 | Ueda et al. ..................... | 257/204 |
| 6,194,915 B1 | * | 2/2001 | Nakayama et al. ........... | 326/121 |
| 6,309,940 B1 | * | 10/2001 | Lee ................. | 438/370 |
| 6,410,964 B1 | * | 6/2002 | Shida ............................ | 257/356 |
| 6,784,496 B1 | | 8/2004 | Brodsky et al. | |
| 6,833,592 B2 | * | 12/2004 | Lee ................. | 257/372 |
| 6,864,539 B2 | * | 3/2005 | Ishibashi et al. .............. | 257/368 |
| 6,885,529 B2 | | 4/2005 | Ker et al. | |
| 6,937,068 B2 | * | 8/2005 | Nakayama et al. ........... | 326/121 |
| 7,067,884 B2 | * | 6/2006 | Okushima ..................... | 257/355 |
| 7,196,378 B2 | | 3/2007 | Ichikawa | |

(Continued)

FOREIGN PATENT DOCUMENTS

JP    8-37283    2/1996

OTHER PUBLICATIONS

Chinese Patent Office issued a Chinese Office Action dated Oct. 30, 2009, Application No. 200710139935.8.

*Primary Examiner* — Hoai V Pham
*Assistant Examiner* — Eric Jones
(74) *Attorney, Agent, or Firm* — Young & Thompson

(57) ABSTRACT

Latchup is prevented from occurring accompanying increasingly finer geometries of a chip. NchMOSFET N1 and PchMOSFET P1 form a CMOS circuit including: NchMOSFET N2 whose gate, drain and back gate are connected to back gate of N1 and PchMOSFET P2 whose gate, drain and back gate are connected to back gate of P1. Source of N2 is connected to source of N1. Source of P2 is connected to source of P1. N2 is always connected between the grounded source of N1 and the back gate of N1, while P2 is connected between source of P1 connected to a power supply and the back gate of P1. Each of N2 and P2 functions as a voltage limiting element (a limiter circuit).

10 Claims, 6 Drawing Sheets

U.S. PATENT DOCUMENTS

| | | | |
|---|---|---|---|
| 7,268,400 B2 * | 9/2007 | Cecchi et al. | 257/371 |
| 7,358,573 B2 * | 4/2008 | Cecchi et al. | 257/371 |
| 2001/0043449 A1 * | 11/2001 | Okushima | 361/56 |
| 2002/0033510 A1 * | 3/2002 | Tomita | 257/372 |
| 2003/0193765 A1 | 10/2003 | Kitano | |
| 2004/0036497 A1 * | 2/2004 | Nakayama et al. | 326/27 |
| 2004/0155291 A1 * | 8/2004 | Okushima | 257/355 |
| 2006/0223258 A1 * | 10/2006 | Okushima | 438/202 |
| 2007/0109906 A1 * | 5/2007 | Leung | 365/230.06 |
| 2007/0120198 A1 * | 5/2007 | Chen et al. | 257/372 |
| 2007/0170517 A1 * | 7/2007 | Furukawa et al. | 257/372 |
| 2007/0194380 A1 * | 8/2007 | Okushima | 257/355 |
| 2008/0036011 A1 * | 2/2008 | Okushima | 257/372 |
| 2008/0054368 A1 * | 3/2008 | Mandelman et al. | 257/372 |
| 2008/0258177 A1 * | 10/2008 | Ikeda et al. | 257/207 |

* cited by examiner

US 8,072,032 B2

SEMICONDUCTOR INTEGRATED CIRCUIT DEVICE HAVING LATCHUP PREVENTING FUNCTION

RELATED APPLICATION

This application is based upon and claims the benefit of the priority of Japanese patent application No. 2006-215489, filed on Aug. 8, 2006, the disclosure of which is incorporated herein in its entirety by reference thereto.

FIELD OF THE INVENTION

The present invention relates to a semiconductor integrated circuit device. More specifically, the invention relates to a semiconductor integrated circuit device including a latchup preventing function.

BACKGROUND OF THE INVENTION

The following analysis on the related art is presented by the present invention.

In CMOS circuits, a phenomenon referred to as a phenomenon called as "latchup" sometimes happens. In this phenomenon, a thyristor is formed by a pair of an npn bipolar transistor and a pnp bipolar transistor generated accompanied by the structures of nMOS transistor and pMOS transistor and well(s), and this thyristor turns on by noise or the like. FIG. 5 is a sectional view schematically showing a structure of a semiconductor integrated circuit device including a CMOS circuit, as an example. Referring to FIG. 5, in the semiconductor integrated circuit device, a deep n well 120, a p well 121, and an n well 122 are formed in a p substrate 110. The p well 121 includes n+ diffusion layers 125 and 126. Together with a gate electrode 127a, the n+ diffusion layers 125 and 126 form an nMOS transistor. The p well 121 further includes a p+ diffusion layer 151. A back bias control circuit 140a supplies a back bias to the p well 121 via the p+ diffusion layer 151. Further, the n+ diffusion layer 126 that corresponds to a source of the nMOS transistor is connected to ground GND.

On the other hand, the n well 122 includes p+ diffusion layers 128 and 129. Together with a gate electrode 127b, the p+ diffusion layers 128 and 129 form a pMOS transistor. The n well 122 includes an n+ diffusion layer 152. A back bias control circuit 140b supplies a back bias to the n well 122 via the n+ diffusion layer 152. The p+ diffusion layer 129 that corresponds to a source of the pMOS transistor is connected to a power supply VDD. Further, a device separation region 115 is provided between the respective diffusion layers.

In the semiconductor integrated circuit device having such a structure, the n well 122, p well 121, and n+ diffusion layer 126 form an npn bipolar transistor Q1. The p well 121, n well 122, and p+ diffusion layer 129 form a pnp bipolar transistor Q2. Then, the npn bipolar transistor Q1 and the pnp bipolar transistor Q2 form a thyristor. When this thyristor turns on by noise or the like and the latchup occurs, a large short-circuit current Is will flow from the power supply VDD to the ground GND. An operation of the semiconductor integrated circuit device itself will thereby become unstable. Accordingly, it is important to prevent occurrence of the latchup as described above.

By the way, the latchup as described above tends to occur at such a time as power-on when a voltage is not stabilized. Each of the back bias control circuits 140a and 140b, in particular, is often configured to supply the voltage boosted by a charge pump circuit or the like. Thus, each of the back bias control circuits 140a and 140b does not always supply a sufficiently stable voltage, as a power supply path. Then, Patent Document 1 discloses a semiconductor integrated circuit that prevents a latchup phenomenon at the time of power-on. This semiconductor integrated circuit is configured so that when a ground potential is employed as a low potential VSS, a power supply terminal that supplies the low potential VSS and a p-type region that forms an n-channel MOS transistor are short circuited from start of a power supply potential VDD is supplied until a bias circuit is operated; and then after the bias circuit starts operation, the power supply terminal and the p-type region are disconnected to supply a negative potential to the p-type region. Accordingly, a potential at the P-type region with which the n-channel type MOS transistor is formed will not transiently rise to a positive potential, and application of a voltage in a forward direction will not be applied across the n-type source region and the p-type region. The latchup can be thereby prevented.

[Patent Document 1]
JP Patent Kokai Publication No. JP-A-8-37283

SUMMARY OF THE DISCLOSURE

Following further discussion on the related art is given by the present invention.

With further downscaling of feature size in advanced CMOS technologies, well leakage current (I leak in FIG. 5) of an internal transistor itself are increasing. The well leakage current (I leak) of the internal transistor includes a well current Ihcl caused by a hot carrier generated when a channel current flows, a gate leakage current Igate that flows from a gate electrode to a well, and a band-to-band tunneling current Ibtbt that leaks from a drain electrode caused by a high electric filed between a drain and a well. The well leakage current of the internal transistor is then the sum of the well current Ihcl, gate leakage current Igate, and band-to-band tunneling current Ibtbt (Ileak=Incl+Igate+Ibtbt). When a supply voltage is abruptly changed during an operation of the semiconductor integrated circuit device, using a power supply switch that turns on or off a power supply by an internal transistor therein, a displacement current Idisplace induced by a junction capacitance of a power supply line flows into a well.

FIG. 6 is a plan view showing a typical semiconductor integrated circuit device on a cell based integrated circuit. Referring to FIG. 6, the semiconductor integrated circuit device includes a p well region 121 formed in a band form in a substrate, an n well region 122 that is formed in a band form in the substrate and arranged in parallel with and adjacent to the p well region 121, back bias supplying power supply lines 123 and 124, a power supply line 132, and a ground line 133. Further, the semiconductor integrated circuit device includes a plurality of basic cells 115 formed over (or across) the p well region 121 and the n well region 122.

The p well region 121 includes a p+ diffusion layer 151, an n+ diffusion layer 125, and an n+ diffusion layer 126. The p+ diffusion layer 151 forms a connecting portion associated with the back bias supplying power supply line 123 that supplies a back bias (substrate bias) to be supplied to the p well region 121. The n+ diffusion layer 125 becomes a drain of an nMOSFET N1 that forms a basic cell 115, and the n+ diffusion layer 126 becomes a source of the nMOSFET N1. The n well region 122 includes an n+ diffusion layer 152, a p+ diffusion layer 128, and a p+ diffusion layer 129. The n+ diffusion layer 152 forms a connecting portion associated with the back bias supplying power supply line 124 that supplies a back bias to be supplied to the n well region 122. The p+ diffusion layer 128 becomes a drain of a pMOSFET P1 that forms the basis cell 115, and the p+ diffusion layer 129 becomes a source of the pMOSFET P1.

The back bias supplying power supply line 123 is connected to the p+ diffusion layer 151 via contacts, and supplies the back bias (a substrate bias) to the p well region 121. The back bias supplying power supply line 124 is connected to the n+ diffusion layer 152 via contacts and supplies the back bias to the n-well region 122. The power supply line 132 is connected to the p+ diffusion layer 129 via a contact, and supplies power to the source of the pMOSFET P1 that forms the basic cell 115. The ground line 133 is connected to the n+ diffusion layer 126 via a contact, and supplies a ground potential to the source of the nMOSFET N1 that forms the basic cell 115. A plurality of connecting portions associated with the back bias supplying power supply line 123 and 124, respectively, i.e., the plurality of the p+ diffusion layers 151 and the n+ diffusion layers 152 are present in the p well region 121 and the n well region 122, respectively.

Gates of the pMOSFET P1 and the nMOSFET N1 are made to be common by a gate electrode 127, and are connected to a line 130 via a contact. The gates of the pMOSFET P1 and the nMOSFET N1 become an input terminal of the basic cell 115 that constitutes a CMOS inverter circuit. The drains of the pMOSFET P1 and nMOSFET N1 are each connected to a line 131 via a contact, and become an output terminal of the basic cell 115 that constitutes the CMOS inverter circuit. Incidentally, referring to FIG. 6, the basic cells other than the basic cell 115 have the same structure as that of the basic cell 115, and the illustration thereof being omitted for simplifying illustration.

In the semiconductor integrated circuit device having such a structure, as the layout gets finer, the size of the basic cells decreases. That is, in case where the cell height gets smaller and the well height becomes smaller, e.g., to 0.8 μm, the well layout needs to be longer and thinner in size, provided that the interval between the well-contact points (151, 152) be constant, e.g., of 100 μm. In order to control the well potential, the p well region 121 is separated by a deep n well. With these arrangements, a sheet resistance of the p well region 121 is increased, and a resistance value of a well resistance Rwell rises. In an example of the semiconductor integrated circuit device of a 65 nm generation, for example, when the well height is 0.8 μm and to the interval between the well contact regions for setting the potential using a metal wiring is 100 μm, the well resistance will become as large as approximately 200 kΩ.

For this reason, when external noise is applied to the power supply line during operation of an LSI or when an abrupt rise of the power supply line occurs, a large well leakage current (herein a combination of the currents Ileac and IdDisplace is regarded as the well leakage current) is injected into a well from an internal transistor. Then, due to elevated the well resistance, the well potential will greatly rise or fall locally, and the latchup tends to occur in an internal region. A well potential variation around a point "A" in FIG. 6, for example, in the vicinity of an intermediate point between the two points of connecting portions associated with the back bias supplying power supply lines 123 and 124, respectively, in particular, tends to become manifest. Accordingly, when the latchup occurs at the point "A", a large short-circuit current Is will flow from the power supply line 132 to the ground line 133, as shown by a solid arrow Is.

On contrast therewith, in the semiconductor integrated circuit in Patent Document 1, the power supply terminal that supplies the low potential VSS (=GND) and the p-type region (well) are just short-circuited at the time of power-on. More specifically, referring to FIG. 6, the semiconductor integrated circuit just serves to reduce an increase in a potential in the p+ diffusion layer 151 at the time of power-on. Thus, a well potential variation in the vicinity of the point "A" in the p-well region 121 caused by the well leakage current cannot be reduced sufficiently. Further, reduction of the well potential variation in the vicinity of the point "A" after power-on is also impossible. Accordingly, it is difficult to prevent the latchup during a usual operation that tends to occur accompanying increasingly finer geometries of the semiconductor integrated circuit device.

According to an aspect of the present invention, there is provided a semiconductor integrated circuit device including a CMOS circuit. The semiconductor integrated circuit device comprises a first MOSFET forming the CMOS circuit; and a first limiter circuit connected between a back gate of the first MOSFET and a source of the first MOSFET, the first limiter circuit limiting a forward voltage at a pn junction formed between the back gate and the source so that a forward current at the pn junction is cut off.

According to another aspect of the present invention there is provided a semiconductor integrated circuit device including a CMOS circuit. The semiconductor integrated circuit device comprises: a well region of a first conductivity type formed in a band form in a substrate; a well region of a second conductivity type formed in a band form in the substrate, the well region of the second conductivity type being arranged in parallel with the well region of the first conductivity type; a first diffusion region of the first conductivity type formed in the well region of the first conductivity type and connected to a first back bias supplying power supply line that supplies a back bias to be supplied to the well region of the first conductivity type; first and second power supply lines that supply power to the CMOS circuit; and a MOSFET of the second conductivity type formed in the well of the first conductivity type, a gate and a drain of the MOSFET of the second conductivity type being connected to the well region of the first conductivity type, and a source of the MOSFET of the second conductivity type being connected to the first power supply line.

The meritorious effects of the present invention at least includes the following effects.

According to the present invention, the first limiter circuit (MOSFET of the second conductivity type) always functions as a voltage limiting element for the back gate. Thus, a latchup that tends to occur accompanying the increasingly finer geometries of a semiconductor integrated circuit device can be prevented. Further advantages will become apparent in the entire disclosure including claims and drawings.

PREFERRED MODES OF THE INVENTION

Figure 1:
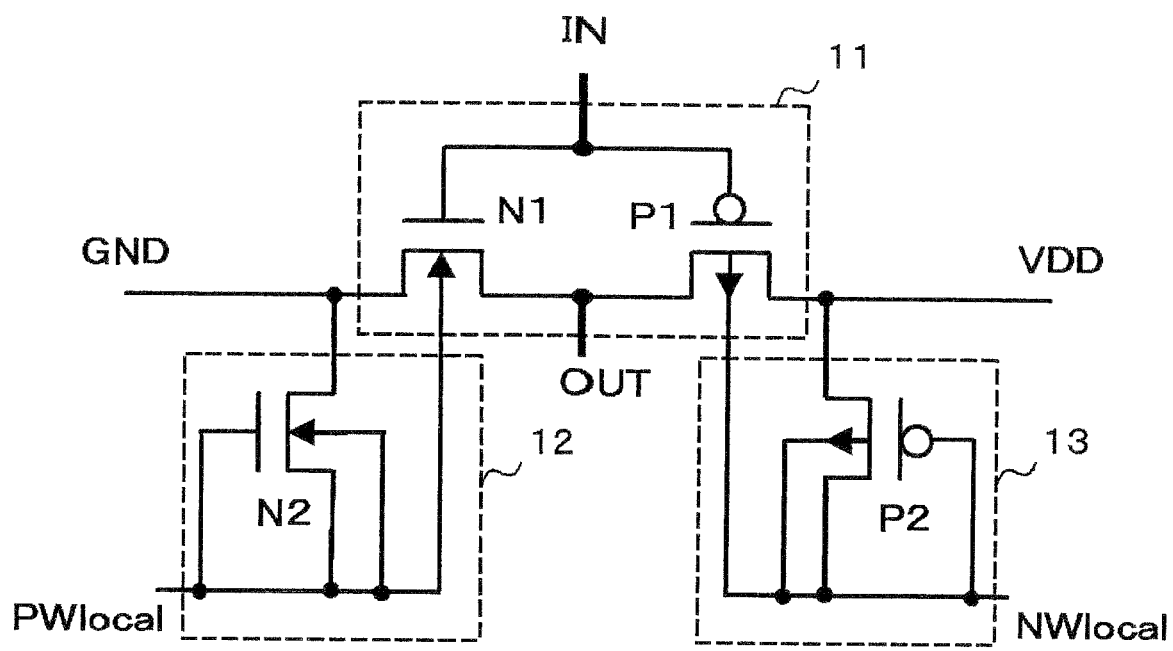
FIG. 1 shows a diagram of circuits in a semiconductor integrated circuit device according to a first example of the present invention.

In the first aspect, the following modes may be employed.

The first limiter circuit may be formed of a second MOSFET, the second MOSFET having the same conductivity type as the first MOSFET; and a gate, a drain and a back gate of the second MOSFET are connected to the back gate of the first MOSFET, and a source of the second MOSFET is connected to the source of the first MOSFET.

The semiconductor integrated circuit device may further comprise: a third MOSFET forming the CMOS circuit, the third MOSFET having a conductivity type opposite to a conductivity type of the first MOSFET; and a second limiter circuit connected between a back gate of the third MOSFET and a source of the third MOSFET, the second limiter circuit limiting a forward voltage at a pn junction formed between the back gate of the third MOSFET and the source of the third MOSFET so that a forward current at the pn junction is cut off.

The second limiter circuit may be formed of a fourth MOSFET, the fourth MOSFET having the same conductivity type as the third MOSFET; and a gate, a drain and a back gate of the fourth MOSFET are connected to the back gate of the third MOSFET, and a source of the fourth MOSFET is connected to the source of the third MOSFET.

In the second aspect, the following further modes may be employed.

A plurality of the first diffusion regions of the first conductivity type may be present in the well region of the first conductivity type, and a second diffusion region of the first conductivity type may be arranged generally in the middle of two of the first diffusion regions of the first conductivity type, the second diffusion region of the first conductivity type serving as a connecting spot between the drain of the MOSFET of the second conductivity type and the well region of the first conductivity type.

The semiconductor integrated circuit device may further comprise: a plurality of cells each formed over the well region of the first conductivity type and the well region of the second conductivity type; at least one portion of each of the cells including the MOSFET of the second conductivity type and a second diffusion region of the first conductivity type, the second diffusion region of the first conductivity type serving as a connecting spot between the drain of the MOSFET of the second conductivity type and the well region of the first conductivity type.

A drain region of the MOSFET of the second conductivity type and the second diffusion region of the first conductivity type may be formed, adjacent to each other, in the well region of the first conductivity type.

The semiconductor integrated circuit device may further comprise: a first diffusion region of the second conductivity type formed in the well of the second conductivity type, the first diffusion region of the second conductivity type being connected to a second back bias supplying power supply line that supplies a back bias to be supplied to the well region of the second conductivity type; and a MOSFET of the first conductivity type formed in the well region of the second conductivity type, a gate and a drain of the MOSFET of the first conductivity type being connected to the well region of the second conductivity type, and a source of the MOSFET of the first conductivity type being connected to the second power supply line.

A plurality of the first diffusion regions of the second conductivity type may be present in the well region of the second conductivity type, and a second diffusion region of the second conductivity type may be arranged generally in the middle of two of the first diffusion regions of the second conductivity type, the second diffusion region of the second conductivity type serving as a connecting spot between the drain of the MOSFET of the first conductivity type and the well region of the second conductivity type.

The semiconductor integrated circuit device may further comprise: a plurality of cells each formed over the well region of the first conductivity type and the well region of the second conductivity type; at least one portion of each of the cells including the MOSFET of the first conductivity type, a second diffusion region of the second conductivity type, the MOSFET of the second conductivity type, and a second diffusion region of the first conductivity type; the second diffusion region of the second conductivity type serving as a connecting point between the drain of the MOSFET of the first conductivity type and the well region of the second conductivity type; the second diffusion region of the first conductivity type serving as a connecting spot between the drain of the MOSFET of the second conductivity type and the well region of the first conductivity type.

A drain region of the MOSFET of the first conductivity type and the second diffusion region of the second conductivity type may be formed, adjacent to each other, in the well region of the second conductivity type.

A semiconductor integrated circuit device according to an exemplary embodiment of a present invention is a semiconductor integrated circuit device including a CMOS circuit (11 in FIG. 1). This semiconductor integrated circuit device includes a first nMOSFET (N1 in FIG. 1) that forms the CMOS circuit and a second nMOSFET (N2 in FIG. 1) whose gate, drain and back gate are connected to a back gate of the first nMOSFET. A source of the second nMOSFET is connected to a source of the first nMOSFET. The semiconductor integrated circuit device may further include a second pMOSFET (P2 in FIG. 1) for a first pMOSFET (P1 in FIG. 1) that forms the CMOS circuit. A gate, drain and back gate of the second pMOSFET are connected to a back gate of the first pMOSFET, and a source of the second PMOSFET is connected to a source of the first pMOSFET.

The semiconductor integrated circuit device having the configuration as described above includes a p well region (21 in FIG. 2) formed in a band form in a substrate, an n well region (22 in FIG. 2) that is formed in a band form in the substrate and arranged in parallel with and adjacent to the p well region, a p+ diffusion layer (51 in FIG. 2) connected to a first back bias supplying power supply line (23 in FIG. 2) that supplies a back bias to be supplied to the p well region, a power supply line (32 in FIG. 2) that supplies power to the CMOS circuit, a ground line (33 in FIG. 2), and the nMOSFET (N2 in FIG. 2) formed in the p well region. A gate and drain of the nMOSFET are connected to the p well region, and a source of the nMOSFET is connected to the ground line. The semiconductor integrated circuit device may further include an n+ diffusion layer (52 in FIG. 2) connected to a second back bias supplying power supply line (24 in FIG. 2) that supplies a back bias to be supplied to the n well region and a pMOSFET (indicated by P2 in FIG. 2) formed in the n well region. A gate and drain of the pMOSFET are connected to the n well region, and a source of the pMOSFET is connected to the power supply line.

Figure 2:
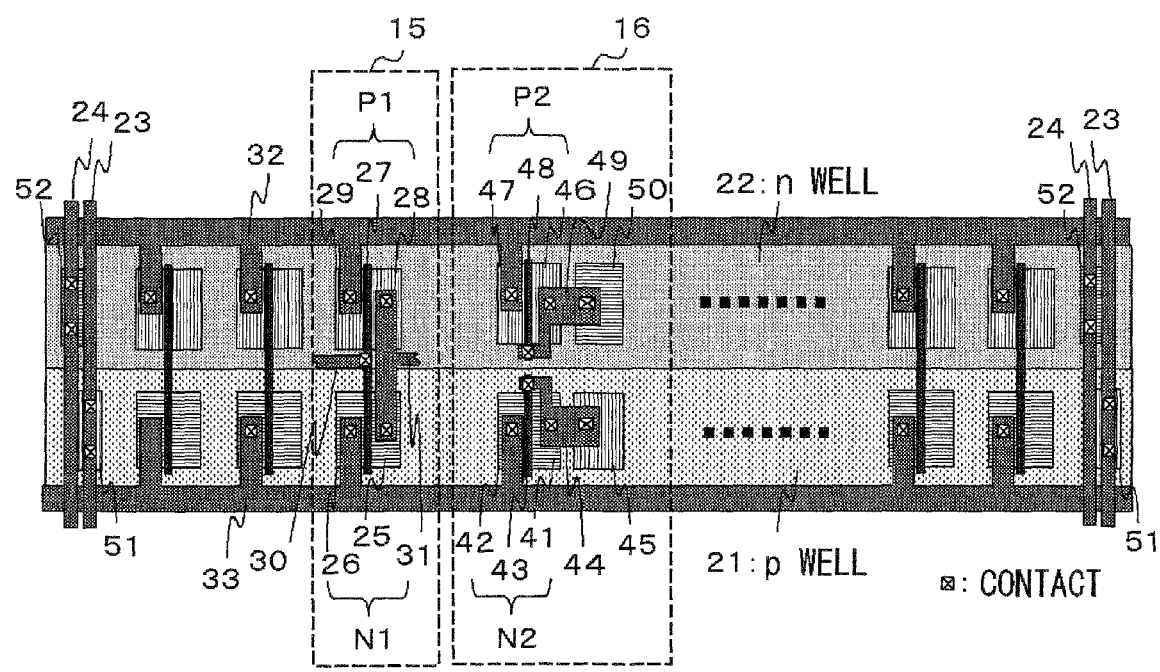
FIG. 2 is a plan view showing a structure of the semiconductor integrated circuit device according to the first example of the present invention.

In the semiconductor integrated circuit device as described above, it is preferable that a plurality of the p+ diffusion layers (51 in FIG. 2) are present in the p well region, and a p+ diffusion layer (45 in FIG. 2) that serves as a connecting spot between the drain of the nMOSFET (N2 in FIG. 2) and the p well region is formed generally in the middle between two of the p+ diffusion layers (51 in FIG. 2). Further, it is preferable that a plurality of the n+ diffusion layers (52 in FIG. 2) are present in the n well region, and an n+ diffusion layer (50 in FIG. 2) that serves as a connecting spot between the drain of the pMOSFET (P2 in FIG. 2) and the n well region is formed generally in the middle between two of the n+ diffusion layers (52 in FIG. 2).

It may be so arranged that the semiconductor integrated circuit device includes a plurality of cells (15 in FIG. 2) formed across and over the p well region and the n well region, and that at least one portion of each of the cells includes the nMOSFET (N2 in FIG. 2) and the p+ diffusion layer (45 in FIG. 2). Further, it may be so arranged that at least one portion of each of the cells includes the pMOSFET (P2 in FIG. 2) and the n+ diffusion layer (50 in FIG. 2).

Further, it may be so arranged that an n+ diffusion layer (41 in FIG. 4), which is a drain region of the nMOSFET (N2 in FIG. 4), and the p+ diffusion layer (45 in FIG. 4) are formed in the p well region (21 in FIG. 4) being adjacent to each other. Such a configuration is referred to as a butting arrangement (a butting layout) since the n+ diffusion layer and the p+ diffusion layer are arranged being adjacent to each other. Further, a p+ diffusion layer (46 in FIG. 4), which is a drain region of the pMOSFET (P2 in FIG. 4) and the n+ diffusion layer (50 in FIG. 4) may be formed in the n well region (22 in FIG. 4) as the butting arrangement.

According to the semiconductor integrated circuit device configured as described above, the nMOSFET (N2 in FIG. 2 or 4) is always connected between a ground and the p well region (back gate), and functions as a voltage limiting element (a limiter circuit) so that a forward current does not flow through a pn junction. Accordingly, a latchup caused by forward conduction between the ground and the p well region can be prevented. Further, the pMOSFET (P2 in FIG. 2 or 4) is always connected between a power supply and the n well region (back gate), and functions as the voltage limiting element (limiter circuit) so that the forward current does not flow through a pn junction. Likewise, a latchup caused by forward conduction between the power supply and the n well region can be prevented. The latchup prevention manner or principle in the semiconductor integrated circuit device as described above is not limited to a circuit that is subject to back bias control, and is also effective for prevention of the latchup in an internal circuit where a well leakage current Ileak and a well resistance Rwell are great. A description will be given below in detail with reference to drawings, and in connection with examples.

FIRST EXAMPLE

FIG. 1 shows a diagram of circuits in the semiconductor integrated circuit device according to a first example of the present invention. Referring to FIG. 1, the semiconductor integrated circuit device includes an inverter circuit 11 and limiter circuits 12 and 13. The inverter circuit 11 is constituted from a CMOS circuit formed of a pMOSFET P1 and an nMOSFET N1. The limiter circuit 12 includes an nMOSFET N2. The limiter circuit 13 includes a pMOSFET P2. The drain, gate and back gate of the nMOSFET N2 are connected in common to the back gate of the nMOSFET N1 (PWlocal). The sources of the nMOSFET N2 and the nMOSFET N1 are connected in common to a ground GND. On the other hand, the drain, gate and back gate of the pMOSFET P2 are connected in common to the back gate of the pMOSFET P1 (NWlocal). The sources of the pMOSFET P2 and the pMOSFET P1 are connected in common to a power supply VDD.

Next, a structure of the semiconductor integrated circuit device including the circuits of the configurations as described above will be described. FIG. 2 is a plan view showing the structure of the semiconductor integrated circuit device according to the first example of the present invention. Referring to FIG. 2, the semiconductor integrated circuit device includes a p well region 21 formed in the band form in the substrate, n well region 22, back bias supplying power supply lines 23 and 24, power supply line 32, and ground line 33. The n well region 22 is formed in the band form in the substrate and arranged in parallel with and adjacent to the p well region 21. The semiconductor integrated circuit device further includes a plurality of the basic cells 15 and latchup preventing cells 16, which are all arranged over (and across) the p well region 21 and the n well region 22.

The p well region 21 includes the p+ diffusion layer 51 that forms a connecting portion associated with the back bias supplying power supply line 23 that supplies the back bias to be supplied to the p well region 21, an n+ diffusion layer 25, an n+ diffusion layer 26, an n+ diffusion layer 41, an n+ diffusion layer 42, and a p+ diffusion layer 45. The n+ diffusion layer 25 becomes a drain of the nMOSFET N1 that forms a basic cell 15. The n+ diffusion layer 26 becomes the source of the nMOSFET N1. The n+ diffusion layer 41 becomes a drain of the nMOSFET N2. The n+ diffusion layer 42 becomes a source of the nMOSFET N2. The p+ diffusion layer 45 includes a function of detecting a potential of the p well region 21 at a position where a latchup preventing cell 16 is arranged.

The n well region 22 includes an n+ diffusion layer 52 that forms a connecting portion associated with the back bias supplying power supply line 24 that supplies the back bias to be supplied to the n well region 22, a p+ diffusion layer 28, a p+ diffusion layer 29, a p+ diffusion layer 46, a p+ diffusion layer 47, and an n+ diffusion layer 50. The p+ diffusion layer 28 becomes a drain of the pMOSFET P1 that forms a basic cell 15. The p+ diffusion layer 29 becomes the source of the pMOSFET P1. The p+ diffusion layer 46 becomes a drain of a pMOSFET P2. The p+ diffusion layer 47 becomes a source of the pMOSFET P2. The n+ diffusion layer 50 includes a function of detecting a potential of the n well region 22 at a position where the latchup preventing cell 16 is arranged.

The back bias supplying power supply line 23 is connected to the p+ diffusion layer 51 via contacts, and supplies the back bias (voltage) to the p well region 21. The back bias supplying power supply line 24 is connected to the n+ diffusion layer 52 via contacts, and supplies the back bias to the n well region 22. A power supply line 32 is connected to the p+ diffusion layer 29 via a contact and is also connected to the p+ diffusion layer 47 via a contact. The power supply line 32 supplies power to the source of the pMOSFET P1 that forms the basic cell 15 and the source of the pMOSFET P2 that forms the latchup preventing cell 16. A ground line 33 is connected to the n+ diffusion layer 26 via a contact and is also connected to an n+ diffusion layer 42 via a contact. A ground line 33 supplies a ground potential to the source of the nMOSFET N1 that forms the basic cell 15 and the source of the nMOSFET N2 that forms the latchup preventing cell 16. A plurality of the connecting portions associated with the back bias supplying power supply line 23, i.e., the p+ diffusion layers 51 are present in the p well region 21, and a plurality of the connecting portions associated with the back bias supplying power supply line 24, i.e., the n+ diffusion layers 52 are present in the n well region 22. Then, the latchup preventing cell 16 is arranged generally roughly, preferably, in the middle part of two of the (neighboring) connecting portions (51-51; or 52-52).

Gates of the pMOSFET P1 and the nMOSFET N1 are made to be common by a gate electrode 27 and are connected to a line 31 via a contact to become an input terminal of the basic cell 15 that constitutes a CMOS inverter circuit. The drains of the pMOSFET P1 and the nMOSFET N1 are each connected to a line 30 via a contact to become an output terminal of the basic cell 15 that constitutes a CMOS inverter circuit. Referring to FIG. 2, basic cells have the same structure, but the illustration thereof being omitted except for the basic cell 15, for simplification of illustration. An example of the inverter circuit is shown as the basic cell 15. The basic cell 15 is not limited to this configuration. It goes without saying that a well-known basic logic circuit such as a NAND circuit, a NOR circuit, or a flip-flop circuit may be employed as the basic cell.

A gate electrode 43 of the nMOSFET N2 and the n+ diffusion layer 41, which is the drain of the nMOSFET N2, are each connected to a line 44 via a contact. The line 44 is connected to a p+ diffusion layer 45 via a contact. By these connections, potentials of the gate and drain of the nMOSFET N2 the p well region 21 become substantially identical to a potential of where the latchup preventing cell 16 is placed, this potential corresponding to a potential of the back gates of the nMOSFETs N1 and N2.

A gate electrode 48 of the pMOSFET P2 and a p+ diffusion layer 46, which is the drain of the pMOSFET P2, are each connected to a line 49 via a contact. The line 49 is connected to the n+ diffusion layer 50 via a contact. By these connections, potentials of the gate and drain of the pMOSFET P2 become substantially identical to a potential of the n well region 22 at a position where the latchup preventing cell 16 is placed, this potential corresponding to a potential of the back gates of the pMOSFETs P1 and P2.

Figure 3A:
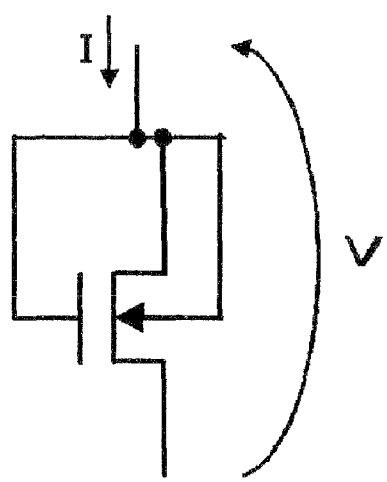
FIGS. 3A and 3B are a diagram and a graph showing a voltage-current characteristic of an nMOSFET whose drain, gate and back gate are connected in common.
Figure 3B:
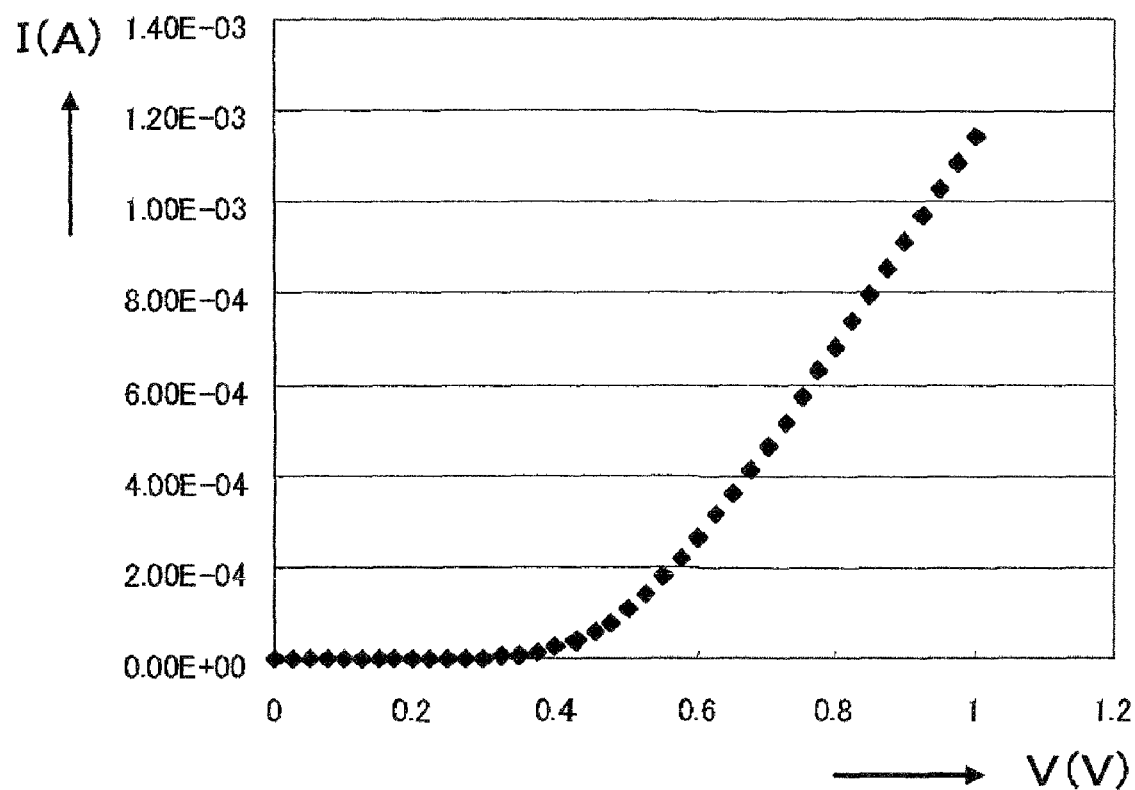

Next, electric characteristics of the nMOSFET N2 and the pMOSFET P2 in each of which the drain, gate and back gate are connected together as described above will be described. Herein, the nMOSFET will be taken up. FIGS. 3A and 3B are a diagram and a graph showing a voltage-current (V-I) characteristic of the nMOSFET. The V-I characteristic of the nMOSFET connected as shown in FIG. 3A is shown in FIG. 3B. A gate length of the nMOSFET and a gate width of the nMOSFET are 0.1 μm and 2 μm, respectively, for instance. Referring to FIG. 3B, this nMOSFET starts to turn on (become conductive) when an applied voltage exceeds approximately 0.3V. A current of 0.3 mA flows at a voltage corresponding to a forward voltage of 0.6V of a pn junction, whereupon a resistance of the nMOSFET assumes approximately 2 kΩ. This resistance value is smaller than a well resistance of approximately 200 kΩ by two digits. The well corresponds to the base of parasitic bipolar NPN and parasitic bipolar PNP formed in the CMOS transistor circuit. When the well potential reaches 0.6V or more, a forward bias is provided between base and emitter, so as to initiate parasitic bipolar operation, followed by parasitic SCR operation resulting in a latch up. Thus the well potential should be kept freed from the forward biasing. Accordingly, when the semiconductor integrated circuit device latches up at 0.6V, a leakage current (current that flows into a well) up to approximately 300 μA can be allowed. A threshold value of the nMOSFET with the drain, gate, and back gate thereof being connected as described above is approximately 0.3V, and this nMOSFET functions as a limiter circuit (a voltage limiting element) to the forward voltage of 0.6V of the pn junction in the semiconductor integrated circuit device. That is, by connecting, in parallel, to the pn junction the nMOSFET with the drain, gate and back gate thereof connected to one another, the nMOSFET operates to cut off a forward current of the pn junction. Incidentally, the pMOSFET shows substantially the same electric characteristics, though not illustrated.

As described above, the nMOSFET N2 with the drain, gate thereof, and back gate connected to one another in the latch up preventing cell 16 is always connected between the ground line 33 and the p well region 21, whereby the nMOSFET N2 functions as a voltage limiting element for preventing flow of the forward current through the pn junction formed in the p well region 21. Accordingly, occurrence of the latchup between the p well region 21 and the n well region 22, caused by a rise in the potential of the p well region 21 and resulting forward conduction of the p well region 21 to the ground, can be prevented. The pMOSFET P2 with the drain, gate and back gate thereof connected to one another in the latch up preventing cell 16 is always connected between the power supply line 32 and the n well region 22. The pMOSFET P2 functions as a voltage limiting element for preventing flow of the forward current through the pn junction formed in the n well region 22. Accordingly, occurrence of the latchup between the p well region 21 and the n well region 22, caused by a fall in the potential of the n well region 22 and resulting forward conduction of the n well region 22 from the power supply, can be prevented.

SECOND EXAMPLE

Figure 4:
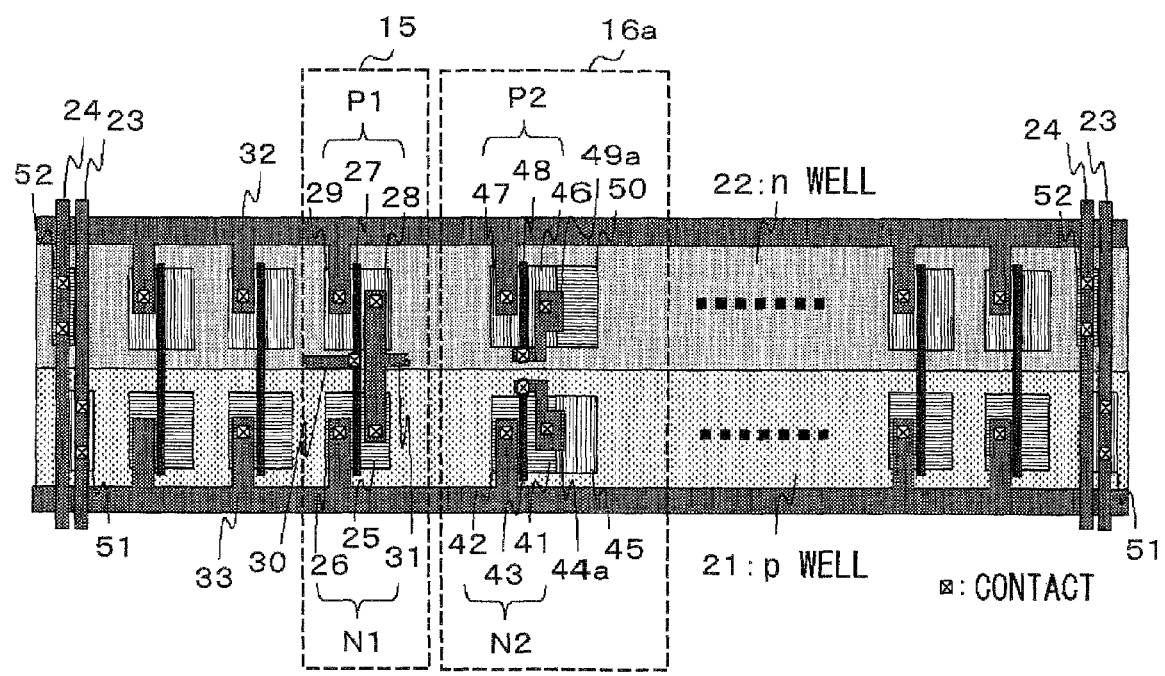
FIG. 4 is a plan view showing a structure of a semiconductor integrated circuit device according to a second example of the present invention.
Figure 5:
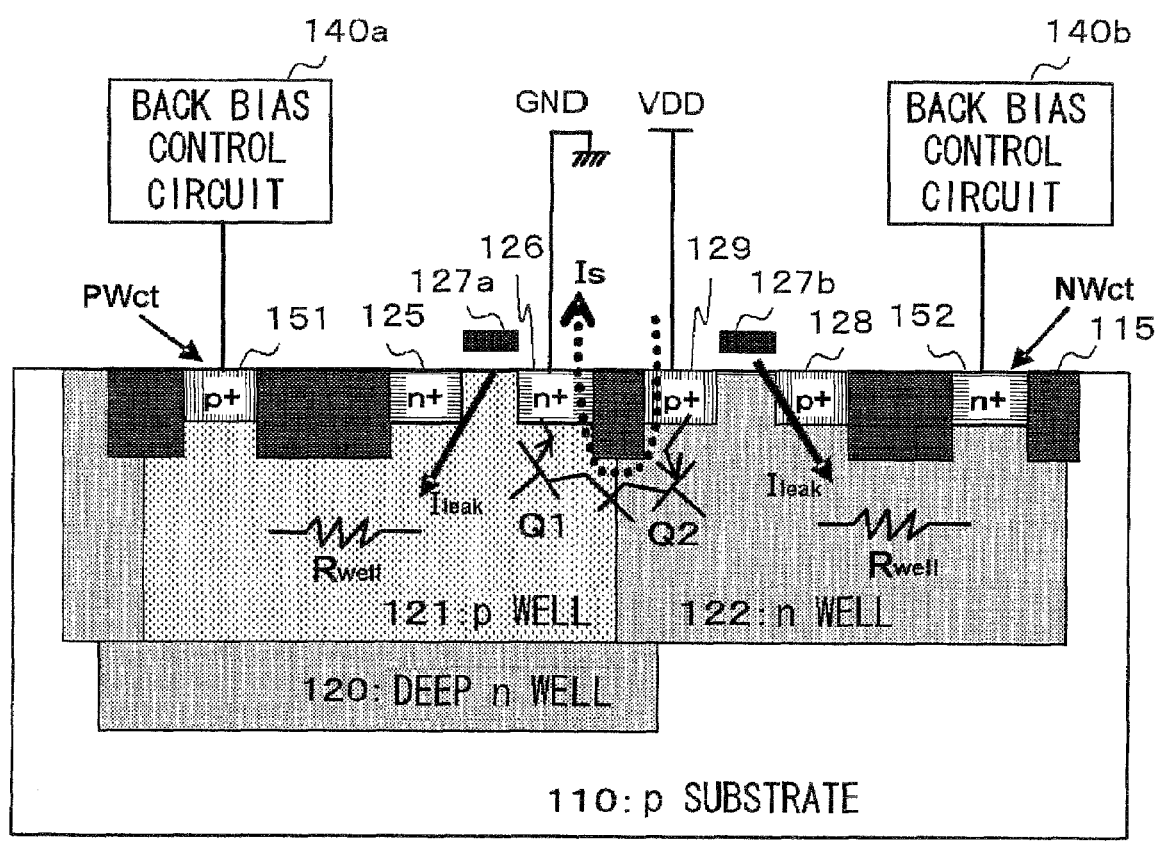
FIG. 5 is a sectional view schematically showing an example of a structure of a semiconductor integrated circuit device including a CMOS circuit.
Figure 6:
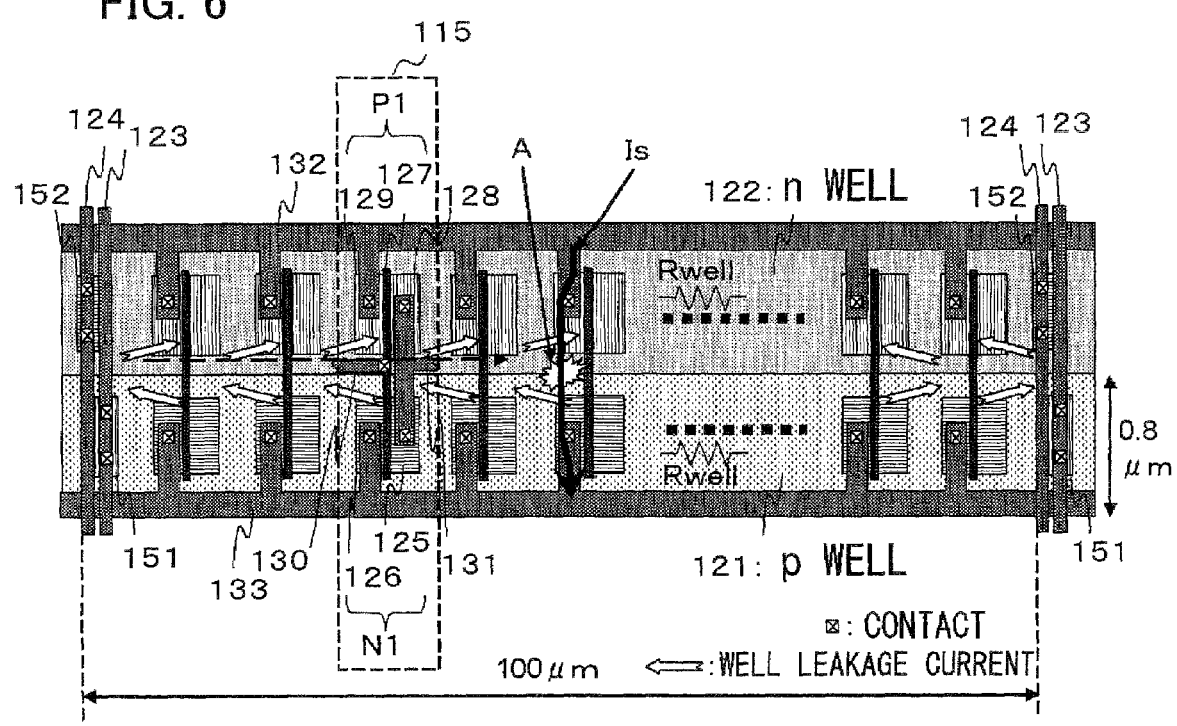
FIG. 6 is a plan view, for discussion, showing a structure of a typical semiconductor integrated circuit device on a cell basis.

FIG. 4 is a plan view showing a structure of a semiconductor integrated circuit device according to a second example of the present invention. Referring to FIG. 4, same reference numerals are assigned to components that are the same as those in FIG. 2, and a description of them will be omitted. The semiconductor integrated circuit device shown in FIG. 4 has a butting (or neighboring) arrangement in a latchup preventing cell 16a where the n+ diffusion layer 41 and the p+ diffusion layer 45 are arranged adjacent to each other. Then, a line 44a is connected to the n+ diffusion layer 41 via a contact, and the line 44a is connected to the gate electrode 43 via a contact. The line 44a is arranged so that the line 44a is not directly connected to the p+ diffusion layer 45. The semiconductor integrated circuit device shown in FIG. 4 further has a butting arrangement in which the p+ diffusion layer 46 and the n+ diffusion layer 50 are arranged adjacent to each other. Then, a line 49a is connected to the p+ diffusion layer 46 via a contact, and the line 49a is connected to the gate electrode 48 via a contact. The line 49a is arranged so that the line 49a is not directly connected to the n+ diffusion layer 50. In the butting arrangements as described above, direct forward conduction between the adjacent diffusion layers will occur.

By using the butting arrangements in the latchup preventing cell 16a configured as described above, the area of the latchup preventing cell 16a becomes smaller than the area of the latchup preventing cell 16 in FIG. 2. This becomes more effective for higher integration of the semiconductor integrated circuit device.

As described above, in the first and second examples, an example where both of the nMOSFET N2 and the pMOSFET P2 are included in the latchup preventing cell is shown. Generally, the leakage current that flows through the well increases more in the p well region 21. Thus, only the nMOSFET N2 may be mounted, as necessary. The first and second examples show an example where the latchup preventing cell is arranged generally in the middle of the (neighboring) two of the connecting portions. A plurality of the latchup preventing cells may be arranged distributed between the two connecting portions. Further, each of the latchup preventing cells may be arranged to be included in all or a portion of each basic cell. Further, a macrocell with the latchup preventing cell incorporated thereinto may be prepared, and this macrocell may be arranged in the semiconductor integrated circuit device.

The above description was given in connection with the examples described above. The present invention is not limited to the examples described above alone, and of course includes various variations and modifications that could be made by those skilled in the art within the claims of the invention in this application.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor integrated circuit device, comprising:
   a CMOS circuit that comprises:
   a well region of a first conductivity type formed in a band form in a substrate;
   a well region of a second conductivity type formed in a band form in said substrate, said well region of the second conductivity type being arranged in parallel with and adjacent to said well region of the first conductivity type;
   a first diffusion region of the first conductivity type formed in said well region of the first conductivity type and connected to a first back bias supplying power supply line that supplies a back bias to be supplied to said well region of the first conductivity type;
   first and second power supply lines that supply power to said CMOS circuit; and
   a MOSFET of the second conductivity type formed in said well of the first conductivity type, a gate and a drain of the MOSFET of the second conductivity type being connected to the well region of the first conductivity type through a second diffusion region of the first conductivity type formed in the well region which is not connected to the first back bias supplying power supply line, and a source of the MOSFET of the second conductivity type being connected to the first power supply line.

2. The semiconductor integrated circuit device according to claim 1, wherein a plurality of the first diffusion regions of the first conductivity type are present in said well region of the first conductivity type, and the second diffusion region of the first conductivity type is arranged generally in the middle of two of said first diffusion regions of the first conductivity type, said second diffusion region of the first conductivity type serving as a connecting spot between the drain of said MOSFET of the second conductivity type and the well region of the first conductivity type.

3. The semiconductor integrated circuit device according to claim 2, wherein a drain region of said MOSFET of the second conductivity type and said second diffusion region of the first conductivity type are formed, adjacent to each other, in said well region of the first conductivity type.

4. The semiconductor integrated circuit device according to claim 1, further comprising:
   a plurality of cells each formed over said well region of the first conductivity type and said well region of the second conductivity type;
   at least one portion of each of said cells including said MOSFET of the second conductivity type and the second diffusion region of the first conductivity type, said second diffusion region of the first conductivity type serving as a connecting spot between the drain of the MOSFET of the second conductivity type and said well region of the first conductivity type.

5. The semiconductor integrated circuit device according to claim 4, wherein a drain region of said MOSFET of the second conductivity type and said second diffusion region of the first conductivity type are formed, adjacent to each other, in said well region of the first conductivity type.

6. The semiconductor integrated circuit device according to claim 1, further comprising:
   a first diffusion region of the second conductivity type formed in said well of the second conductivity type, said first diffusion region of the second conductivity type being connected to a second back bias supplying power supply line that supplies a back bias to be supplied to said well region of the second conductivity type; and
   a MOSFET of the first conductivity type formed in said well region of the second conductivity type, a gate and a drain of said MOSFET of the first conductivity type being connected to said well region of the second conductivity type through a second diffusion region of the second conductivity type formed in the well region which is not connected to the second back bias supplying power supply line, and a source of said MOSFET of the first conductivity type being connected to said second power supply line.

7. The semiconductor integrated circuit device according to claim 6, wherein a plurality of said first diffusion regions of the second conductivity type are present in said well region of the second conductivity type, and the second diffusion region of the second conductivity type is arranged generally in the middle of two of said first diffusion regions of the second conductivity type, said second diffusion region of the second conductivity type serving as a connecting spot between the drain of said MOSFET of the first conductivity type and said well region of the second conductivity type.

8. The semiconductor integrated circuit device according to claim 7, wherein a drain region of said MOSFET of the first conductivity type and said second diffusion region of the second conductivity type are formed, adjacent to each other, in said well region of the second conductivity type.

9. The semiconductor integrated circuit device according to claim 6, further comprising:
   a plurality of cells each formed over said well region of the first conductivity type and said well region of the second conductivity type;
   at least one portion of each of said cells including said MOSFET of the first conductivity type, the second diffusion region of the second conductivity type, said MOSFET of the second conductivity type, and a second diffusion region of the first conductivity type;
   said second diffusion region of the second conductivity type serving as a connecting point between the drain of said MOSFET of the first conductivity type and said well region of the second conductivity type;
   said second diffusion region of the first conductivity type serving as a connecting spot between the drain of said MOSFET of the second conductivity type and said well region of the first conductivity type.

10. The semiconductor integrated circuit device according to claim 9, wherein a drain region of said MOSFET of the first conductivity type and said second diffusion region of the second conductivity type are formed, adjacent to each other, in said well region of the second conductivity type.

* * * * *